(12) United States Patent
Ambrus

(10) Patent No.: US 7,034,385 B2
(45) Date of Patent: Apr. 25, 2006

(54) TOPLESS SEMICONDUCTOR PACKAGE

(75) Inventor: John Ambrus, Long Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/911,951

(22) Filed: Aug. 5, 2004

(65) Prior Publication Data

US 2005/0029634 A1    Feb. 10, 2005

Related U.S. Application Data

(60) Provisional application No. 60/493,065, filed on Aug. 5, 2003.

(51) Int. Cl.
*H01L 29/74* (2006.01)
*H01L 23/02* (2006.01)

(52) U.S. Cl. ............ 257/678; 257/723; 257/670; 257/672; 257/773; 257/107; 257/109; 257/691

(58) Field of Classification Search ......... 257/670, 257/678, 675, 680, 723, 691, 497, 107, 109, 257/773, 672, 676
See application file for complete search history.

(56) References Cited

U.S. PATENT DOCUMENTS

| 5,625,226 | A |   | 4/1997 | Kinzer |
| 6,114,750 | A |   | 9/2000 | Udagawa et al. |
| 6,242,800 | B1 |   | 6/2001 | Munos |
| 6,281,096 | B1 |   | 8/2001 | Ewer |
| 6,307,272 | B1 | * | 10/2001 | Takahashi et al. .......... 257/787 |
| 6,667,547 | B1 | * | 12/2003 | Woodworth et al. ........ 257/696 |
| 6,723,582 | B1 | * | 4/2004 | Glenn et al. ................ 438/107 |
| 6,744,124 | B1 |   | 6/2004 | Chang et al. |
| 6,909,170 | B1 |   | 6/2005 | Chang et al. |

* cited by examiner

*Primary Examiner*—Jasmine Clark
(74) *Attorney, Agent, or Firm*—Ostrolenk, Faber, Gerb & Soffen, LLP

(57) ABSTRACT

A semiconductor package which includes a die pad that is exposed through the top surface of its molded housing, a semiconductor die having one power electrode electrically and mechanically connected to the underside of the die pad, and another power electrode electrically connected to a lead.

19 Claims, 3 Drawing Sheets

TOPLESS SEMICONDUCTOR PACKAGE

RELATED APPLICATION

This application is based on and claims benefit of U.S. Provisional Application No. 60/493,065, filed on Aug. 5, 2003, entitled Topless Semiconductor Package, to which a claim of priority is hereby made and the disclosure of which is incorporated by reference.

BACKGROUND OF THE INVENTION

FIG. 1 shows a perspective external view of a semiconductor package 10 according to the prior art. Semiconductor package 10 includes leads 12 which extend outwardly from molded housing 14 of semiconductor package 10. Semiconductor package 10 is an example of a standard small outline surface mounted package which is adapted for surface mounting onto a substrate 5 (FIG. 4), such as a circuit board. Specifically, leads 12 have been adapted to include terminal ends 12a which can be received by conductive pads 7 (FIG. 4) on a substrate 5 (FIG. 4). Leads 12 thus serve to support a package on a substrate.

Leads 12 further serve as electrical connectors for the semiconductor device contained within molded housing 14. According to a well known design, a semiconductor device such as a power MOSFET can be disposed within molded housing 14 and electrically connected to other elements of a circuit through leads 12 once semiconductor package 10 is properly mounted on a substrate 5 (FIG. 4), such as a circuit board.

Referring now to FIG. 2, in a typical package containing a power MOSFET 16, a number of leads 12d are electrically connected to the drain electrode of power MOSFET 16, at least one lead 12s is electrically connected to the source electrode of power MOSFET 16, and at least one lead 12g is electrically connected to the gate electrode of power MOSFET 16.

Referring now to FIG. 3, in another prior art configuration eight leads may be used, rather than six leads. In the configuration shown by FIG. 3, the source electrode of power MOSFET 16 may be electrically connected to more than one lead 12s.

The configurations shown by FIGS. 2 and 3 are typically referred to as dual in-line packages (DIPs). A dual in-line package includes one row of leads 12 disposed at one side of molded housing 14 and another row of leads 12 parallel to the first row at an opposing side of housing 14.

Referring now to FIG. 4, a semiconductor device, such as a power MOSFET 16, is electrically connected to the leads of the package in the following manner. Drain electrode 18 of power MOSFET 16 is electrically and mechanically connected to die pad 20 by a layer of conductive adhesive such as solder or a conductive epoxy, such as a silver loaded epoxy. In the configuration shown by FIG. 4, die pad 20 is integral with at least one lead 12d, which extends to the exterior of molded housing 14, whereby drain electrode 18 of power MOSFET 16 may be electrically connected to external elements such as conductive pads 7 on substrate 5, as is well known. In addition, source electrode 22 of power MOSFET 16 may be electrically connected to lead 12s by at least one wirebond 24. Specifically, wirebond 24 is bonded to wirebond pad 26 of lead 12s as is well known in the art. Although not shown, gate electrode 28 of power MOSFET 16 is electrically connected to a corresponding lead 12g (not shown) by a wirebond in the same manner as source electrode 22.

In the device shown by FIG. 4, power MOSFET 16 is arranged such that it faces the bottom of the package. That is, power MOSFET 16 is mounted on the bottom surface of die pad 20 facing bottom surface 15 of housing 14, i.e. the surface that would be closest to substrate 5 when semiconductor package 10 is mounted.

Referring to FIG. 5, according to another prior art arrangement, power MOSFET 16 may be mounted on the top surface of die pad 20 facing top surface 13 of housing 14, i.e. the surface that is farthest from substrate 5 when package 10 is mounted.

A semiconductor device, such as power MOSFET 16, generates heat when operating. The heat so generated must be extracted to maintain the proper operation of the semiconductor device. Basically, the more heat extracted, the closer is the semiconductor device to its rated maximum operating temperature. Adequate heat extraction is, therefore, necessary to maintain the proper operation of the semiconductor device in the package.

In the packages shown by FIGS. 4 and 5, die pad 20 is entirely enclosed within molded housing 14. As a result, the dissipation of heat from power MOSFET 16 is hindered. Other packages are known in which the die pad is exposed through the bottom surface of the molded housing. In such packages, the exposed surface of the die mounting pad is either in contact with the substrate, a heat spreader or a heatsink. While heat dissipation is improved in the packages of the latter type, the position of the exposed portion of the die pad (the bottom surface of the molded housing) is less than ideal for heat dissipation by convection. Moreover, exposing the die pad at the bottom of the molded housing restricts the size of the heat spreader or the heatsink that may be used in that a) the lateral space between the leads restricts the width of any heat spreader or heatsink, and b) the space between the bottom surface of molded housing 14 of the package and the substrate on which the package is mounted is limited. These restrictions limit the amount of heat which can be dissipated and thus indirectly limit the size and the rating of the semiconductor device which may be used.

SUMMARY OF THE INVENTION

An objective of the present invention is a semiconductor package which exhibits improved heat dissipation characteristics.

According to the present invention, the die pad of the package is exposed through the top surface of the molded housing. As a result, heat is better removed by convection, and the size of the heatsink which can be used is no longer limited. Therefore, a package according to the present invention can be the size of a conventional package, but can accommodate a semiconductor device of higher power rating.

A semiconductor package according to the present invention includes a semiconductor device, which may include a first power electrode on one surface thereof, a second power electrode, and a control electrode on another opposing surface thereof. In the preferred embodiment, the semiconductor device may be a power MOSFET.

A semiconductor device according to the present invention further includes a die pad. At least one of the power electrodes is electrically connected to a surface of the die pad, and the opposing surface of the die pad is exposed through the top surface of the housing of the package, which may be a molded housing. Thus, in the preferred embodiment of the present invention, the drain electrode of the power MOSFET is electrically connected to a die pad which is exposed through the top surface of a molded housing.

In a first embodiment, the die pad may be integral with a lead, whereby the drain electrode of the power MOSFET may be electrically connected to external elements.

In a second embodiment, the die pad may be electrically connected to a lead by a wire bond.

In a third embodiment, a heat sink may be thermally connected to the exposed portion of the die pad to increase heat dissipation.

The present invention can be applied to any encapsulated semiconductor device which shows significant power dissipation. Thus, the present invention may be applicable to mold-packaged (in polymer or ceramic mold compound) power switching IC's, discrete components such as power MOSFETs, IGBTs, power bipolar transistors, power diodes, and even highly integrated logic IC's like microprocessors.

By exposing the die pad through the top side of the mold of the package according to the present invention the following advantages can be realized:
1. Existing conventional package configurations can be modified to have an improved heat dissipating capability without a need to reconfigure the standard pin out structure, thus no change in the circuit board design is required to make use of a package according to the present invention.
2. A package according to the present invention may allow for the use of a smaller heatsink, which in combination with the improved heat dissipation by air flow from the top of the package could reduce the Tj of the semiconductor device significantly, compared to a conventional package containing a semiconductor device of the same power dissipation rating.
3. Due to improved power dissipation, a smaller amount of power dissipation induced heat would migrate into the circuit board (on which a package according to the present invention is mounted), thus improving the reliability of the other neighboring components. Thus, a "topless" package according to the present invention could also allow additional design improvements related to the thermal dissipation of the semiconductor devices in the final or the late stage of a system.
4. Even without forced air flow or a heat sink, exposing the die pad at the top will improve heat extraction by convection, thus improving the thermal characteristics of the package.
5. A package according to the present invention would involve inexpensive changes to conventional designs.
6. A "topless" design according to the present invention may allow for the use of a smaller heatsink for the same desired operating temperature which in turn allows for further miniaturization of a system.

Other features and advantages of the present invention will become apparent from the following description of the invention which refers to the accompanying drawings.

DETAILED DESCRIPTION OF THE EMBODIMENTS

Figure 1:
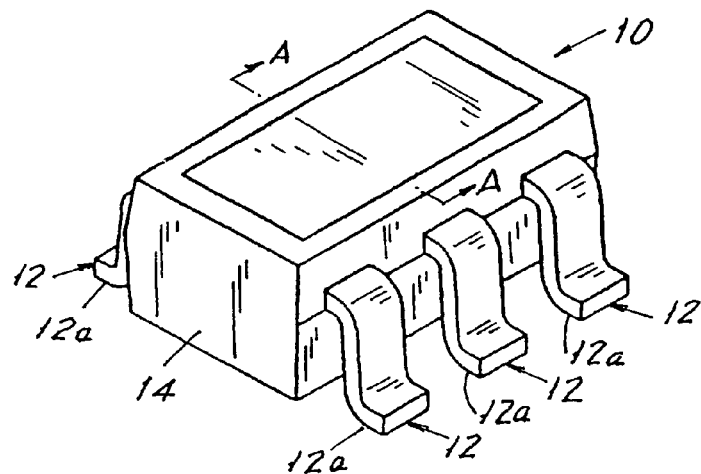
FIG. 1 shows a perspective external view of a semiconductor package according to the prior art.
Figure 2:
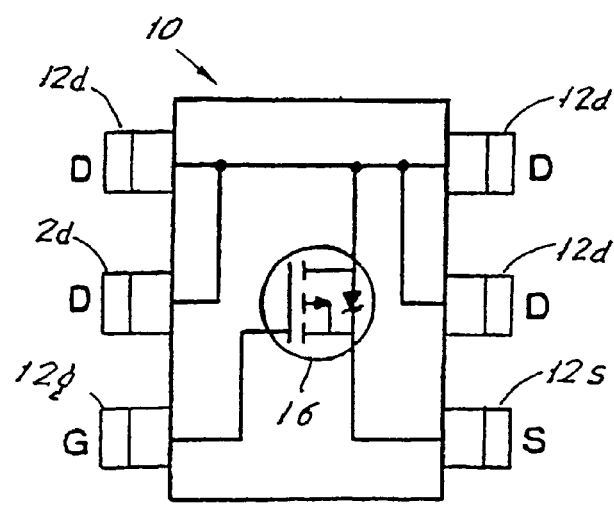
FIG. 2 schematically illustrates the electrical connectivity of a power MOSFET in a semiconductor package according to the prior art.
Figure 3:
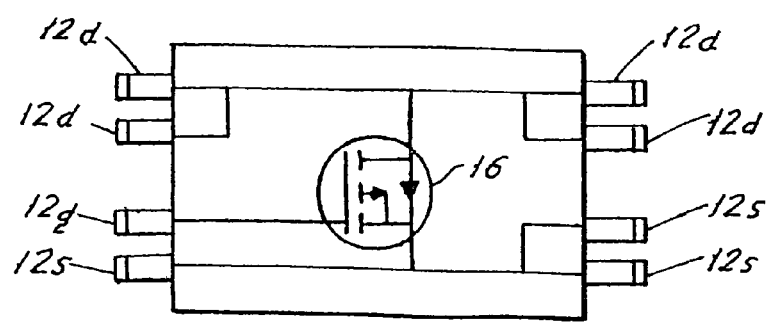
FIG. 3 schematically illustrates the electrical connectivity of a power MOSFET in another semiconductor package according to the prior art.
Figure 4:
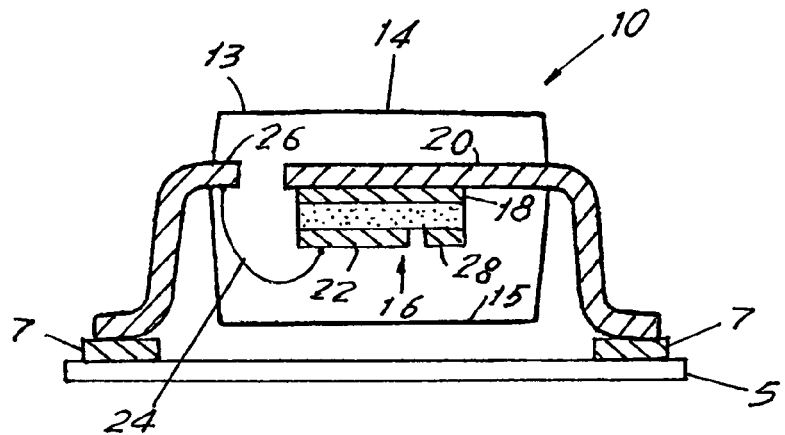
FIG. 4 shows a cross-sectional view of a prior art semiconductor package along line A—A of FIG. 1, viewed in the direction of the arrows.
Figure 5:
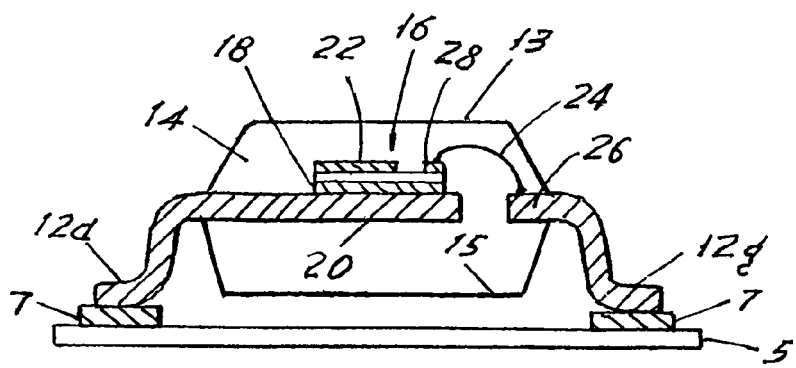
FIG. 5 illustrates a cross-sectional view of an alternative prior art arrangement.
Figure 6:
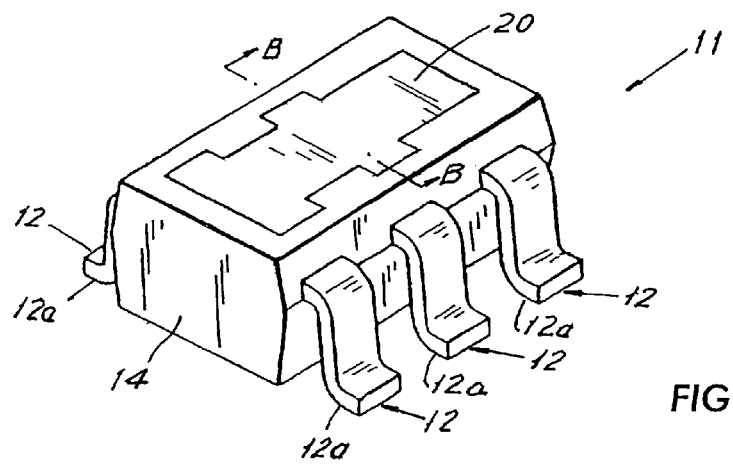
FIG. 6 shows a perspective view of a semiconductor package according to the present invention.

Referring now to FIG. 6, in which like elements are identified with like numerals, a semiconductor package 11 according to the present invention includes die pad 20 which is exposed through molded housing 14. Specifically, according to the present invention, die pad 20 is exposed through top surface 13 of molded housing 14, i.e., the surface which is farthest from substrate 15 when package 11 is mounted.

Figure 7:
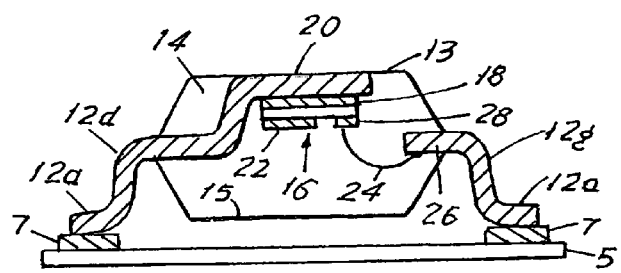
FIG. 7 shows a cross-sectional view of a semiconductor package according to the first embodiment of the present invention as would be seen along line B—B, viewed in the direction of the arrows.

Referring to FIG. 7, in a semiconductor package 20 according to the first embodiment of the present invention, a semiconductor device, such as power MOSFET 16, is mounted on the bottom surface of die pad 20, and the opposing top surface of die pad 20 is exposed through top surface 13 of molded housing 14. Thus, for example, in the preferred embodiment of the present invention in which power MOSFET 16 is the semiconductor device, drain electrode 18 of power MOSFET 16 is electrically and mechanically connected by a conductive adhesive such as solder or conductive epoxy to the bottom side of die pad 20. Therefore, source electrode 22 and gate electrode 28, which are disposed on a surface opposite to drain electrode 18, face bottom surface 15 of molded housing 14, i.e. the surface which is closest to substrate 5 when semiconductor package 11 is mounted thereon.

In the first embodiment of the present invention, die pad 20 is integral with at least one lead 12d, whereby drain electrode 18 becomes electrically connectable to external elements, such as a conductive pad 7 on substrate 5. Furthermore, gate electrode 28 is electrically connected to a respective lead 12g by wirebonds 24. Although not shown, it should be understood that source electrode 22 is electrically connected to at least one lead by one wirebond or more, or a conductive strap, such as a copperstrap.

Figure 8:
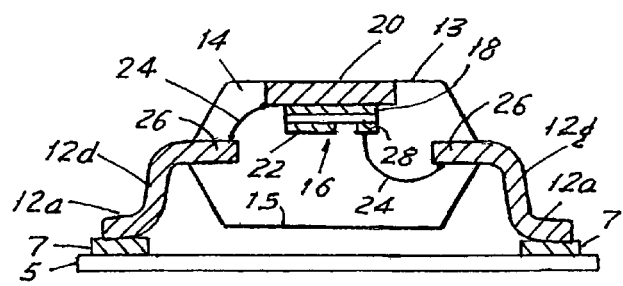
FIG. 8 shows a cross-sectional view of a semiconductor package according to the second embodiment of the present invention as would be seen along line B—B in FIG. 6, viewed in the direction of the arrows.

Referring now to FIG. 8, a semiconductor package according to the second embodiment of the present invention includes all of the elements of the first embodiment. However, unlike the first embodiment, die pad 20 is not integral with lead 12d. Rather, die pad 20 is electrically connected to lead 12d by at least one wirebond 24.

Figure 9:
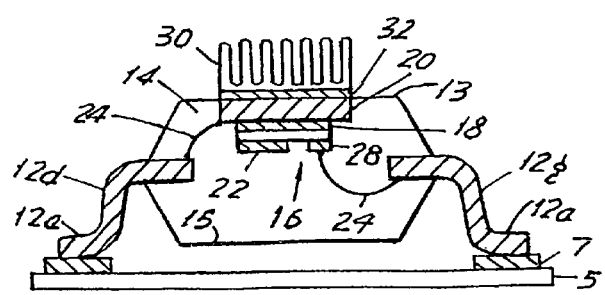
FIG. 9 shows a cross-sectional view of the third embodiment of the present invention.

As can be appreciated from the Figures, once die pad 20 is exposed through top surface 13 of molded housing 14, the semiconductor device contained therein, e.g., power MOSFET 16, can be cooled more easily by exposure to the surrounding air in that air can more easily circulate in the vicinity of the exposed portion of die pad 20. More importantly, by exposing die pad 20 through top surface 13 of molded housing 14, more room is provided for a heat spreader or a heatsink. Thus, referring to FIG. 9, heatsink 30 of any desirable height can be mounted in thermal communication through, for example, a layer of heat transfer paste 32, with die pad 20. Furthermore, the heatsink can be laterally extended even beyond the outline of molded housing 14 in that possible interference from leads 12 is eliminated. Thus, as a result of exposing die pad 20 through top surface of molded housing 14, larger heatsinks may be used. The possibility of use of larger heatsinks may allow for semiconductor devices of a higher power rating (which generate more heat during operation) in a conventional package. Therefore, as a result of the present invention, a conventional package can accommodate semiconductor devices of higher power rating.

A semiconductor package according to the preferred embodiment of the present invention may be a dual in-line package of six pin or eight pin variety.

In addition, in a semiconductor package according to the present invention heatsink 30 may be active or passive. A passive heatsink increases the surface area for natural convection, which increases the rate of heat removal from die pad 20, reducing the temperature of the semiconductor device, e.g. power MOSFET 16. An active heatsink uses energy to cool die pad 20, which further reduces the temperature of the semiconductor device contained within the package.

In a semiconductor package according to the present invention, molded housing 14 may be formed from any conventional epoxy molding compound. In one embodiment, the compound used for forming molded housing 14 comprises an epoxy resin, a curing agent, a catalyst, a filler, a coupling agent promoting adhesion between the matrix polymer and the filler, a flame retardant, a mold-release agent, carbon black and a stress-relief agent that reduces shrinkage and/or crack propagation.

Furthermore, in a semiconductor package according to the present invention wirebond 24 may be formed by any conventional process and of any conventional material, such as gold. Moreover, die pad 20 may be made of a conductive material, such as copper or a copper alloy. For example, the copper alloy may be a copper iron alloy or a beryllium-copper alloy. Leads 12 may also be made of the same material as die pad 20 or of another electrically conductive material.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor package comprising:
   a semiconductor die, said semiconductor die including a first power electrode disposed on a first surface thereof, and a second power electrode disposed on a second opposing surface thereof;
   a die pad and a plurality of leads, said die pad including a first surface and a second surface opposite to said first surface of said die pad, said second surface being electrically and mechanically connected to said second power electrode of said semiconductor die, and said leads including terminal ends adapted for mounting onto a substrate;
   a molded housing, said molded housing including a first exterior surface and a second exterior surface opposite said first exterior surface, said first exterior surface being arranged to be closer to said substrate than said second exterior surface;
   wherein at least said first surface of said die pad is exposed through said second exterior surface of said molded housing, and wherein at least one of said leads is electrically connected to said first power electrode.

2. A semiconductor package according to claim 1, wherein said semiconductor die further includes a control electrode disposed on said first surface of said die.

3. A semiconductor package according to claim 2, wherein said semiconductor die is a power MOSFET in which said first power electrode is a source electrode, said second power electrode is a drain electrode and said control electrode is a gate electrode.

4. A semiconductor package according to claim 1, wherein at least one of said leads includes a wirebond pad at an end thereof residing within said molded housing and connected to at least said first power electrode of said semiconductor die by a wire bond.

5. A semiconductor package according to claim 2, wherein at least one of said leads includes a wirebond pad at an end thereof residing within said molded housing and connected to at least said control electrode of said semiconductor die by a wirebond.

6. A semiconductor package according to claim 1, wherein at least some of said plurality of leads are positioned along one side of said molded housing and the remaining leads are positioned along another opposing side of said molded housing.

7. A semiconductor package according to claim 1, wherein said pad is integral with at least one of said leads.

8. A semiconductor package according to claim 1, wherein each of said leads includes an end disposed within said molded housing and said die pad is spaced from said ends of said external leads.

9. A semiconductor package according to claim 1, further comprising a heat sink in thermal communication with said die pad.

10. A semiconductor package comprising:
    a power MOSFET, said power MOSFET including a drain electrode on one surface thereof, a source electrode and a gate electrode on another opposing surface thereof;
    a lead frame including a die pad and a plurality of leads, said die pad being electrically and mechanically connected to said drain electrode and electrically connected to at least some of said plurality of leads, said source electrode being electrically connected to at least some of said leads and said gate electrode electrically connected to at least one of said leads, and said leads being adapted for surface mounting onto a substrate; and
    a molded housing, said molded housing including a first exterior surface and a second exterior surface, said first exterior surface being arranged closer to said substrate than said second exterior surface;
    wherein said die pad is exposed through said second exterior surface, and wherein at least one of said leads includes a wirebond pad at an end thereof residing within said molded housing and electrically connected to said source electrode by a wire bond.

11. A semiconductor package according to claim 10, wherein at least one of said leads includes a wirebond pad at an end thereof residing within said molded housing and connected to said gate electrode by a wirebond.

12. A semiconductor package according to claim 10, wherein at least some of said plurality of leads are positioned along one side of said molded housing and the remaining external leads are positioned along another opposing side of said molded housing.

13. A semiconductor package according to claim 10, wherein said mounting pad is integral with at least one of said leads.

14. A semiconductor package according to claim 10, wherein each of said leads includes an end disposed within said molded housing and said die mounting pad is spaced from said ends of said leads.

15. A semiconductor package according to claim 10, further comprising a heat sink in thermal communication with said die mounting pad.

16. A semiconductor package comprising:
   a semiconductor die;
   a die pad and a plurality of leads, said die pad including a first surface and a second surface opposite to said first surface of said die pad, said second surface being thermally connected to said semiconductor die, and said leads including terminal ends adapted for mounting onto a substrate; and
   a molded housing, said molded housing including a first exterior surface and a second exterior surface opposite said first exterior surface, said first exterior surface being arranged to be closer to said substrate than said second exterior surface;
   wherein at least said first surface of said die pad is exposed through said second exterior surface of said molded housing, and wherein at least some of said plurality of leads are positioned along one side of said molded housing and the remaining leads are positioned along another opposing side of said molded housing.

17. A semiconductor package according to claim 16, wherein said semiconductor die is either a power MOSFET, an IGBT, a power bipolar transistor, a power diode, an IC, or a semiconductor microprocessor.

18. A semiconductor package according to claim 16, wherein said pad is integral with at least one of said leads.

19. A semiconductor package according to claim 16, further comprising a heat sink in thermal communication with said die pad.

* * * * *